United States Patent [19]
Loutfy et al.

[11] 4,175,982
[45] Nov. 27, 1979

[54] PHOTOVOLTAIC CELL

[75] Inventors: Rafik O. Loutfy, Mississauga; Cheng-Kuo Hsiao, Toronto; James H. Sharp, Oakville, all of Canada

[73] Assignee: Xerox Corporation, Stamford, Conn.

[21] Appl. No.: 921,289

[22] Filed: Jul. 3, 1978

[51] Int. Cl.² ............................................. H01L 31/04
[52] U.S. Cl. ........................... 136/89 SJ; 136/89 NB; 250/211 J; 250/212; 357/8; 357/15; 357/30
[58] Field of Search ...................... 136/89 NB, 89 SJ; 250/211 J, 212; 357/8, 30, 15

[56] References Cited

U.S. PATENT DOCUMENTS

| | | | |
|---|---|---|---|
| 3,009,981 | 11/1961 | Wildi et al. | 136/89 |
| 3,057,947 | 10/1962 | Calvin et al. | 136/89 |
| 3,530,007 | 9/1970 | Golubovic | 136/89 |
| 3,789,216 | 1/1974 | Komp | 250/211 R |
| 3,844,843 | 10/1974 | Kay et al. | 136/206 |
| 4,125,414 | 11/1978 | Tang et al. | 136/89 NB |
| 4,127,738 | 11/1978 | Ghosh | 136/89 NB |

FOREIGN PATENT DOCUMENTS 534808 2/1977 U.S.S.R. ............................. 136/89 NB

OTHER PUBLICATIONS

D. L. Morel et al., "High-Efficiency Organic Solar Cells", *Appl. Phys. Lett.*, vol. 32, pp. 495-497 (1978).
G. A. Alferov et al., "Photoelectrochemical Behaviour of Phthalocyanines Under Galvanostatic Conditions", *Russian J. Phys. Chem.*, vol. 50, pp. 118-120 (1976).
M. I. Fedorev et al., "Photocells Based on Metal Phthalocyanines", *Soviet Physics Journal*, vol. 20, p. 695 (1977).
A. K. Ghosh et al., "Photovoltaic & Rectification Properties of Al/Mg Phthalocyanine/Ag Schottkey Barrier Cells", *J. Appl. Phys.*, pp. 230-236 (1974).
D. L. Morel et al., "Photovoltaic & Rectification Properties of Phthalocyanine Cells", Conf. Record, 10th IEEE Photovoltaic Specialists' Conf. (1973), p. 107.

*Primary Examiner*—Aaron Weisstuch

[57] ABSTRACT

A photovoltaic cell having an improved barrier electrode comprising indium or tin. The cell utilizes metal-free phthalocyanine dispersed in an electrically insulated binder as the photoactive layer in contact with an ohmic electrode.

25 Claims, 6 Drawing Figures

PHOTOVOLTAIC CELL

BACKGROUND OF THE INVENTION

This invention relates to photovoltaic cells and more particularly to such cells containing an improved barrier electrode. Even more particularly, this invention relates to photovoltaic cells wherein the semiconductor, photoactive layer is an organic material comprising a dispersion of metal-free phthalocyanine in a binder which is sandwiched between an ohmic electrode and an indium barrier electrode. Because of the high cost of producing photovoltaic cells utilizing inorganic photoactive layers, there is an interest in finding less expensive alternative photoactive materials for such cells. One approach is to utilize polycrystalline materials which are evaporated or deposited as thin films on an electrode. Although devices are known which are more economical to fabricate than cells utilizing single crystals, the efficiency of such cells are relatively very low. There is thus needed an inexpensively fabricated photovoltaic cell having improved efficiency.

PRIOR ART STATEMENT

The current technology of photovoltaic devices largely employs silicon p-n cells which have a power conversion efficiency of up to about 15 percent. However, the silicon must be of controlled purity and in the form of a single crystal, thus causing the manufacturing cost to be extremely high. Research and development activity is also being carried on with inorganic compounds, such as GaAs, InP/CdS and CdS/Cu$_2$S as photovoltaic device materials. The technology of device fabrication is complex and expensive even though power conversion efficiencies are relatively high (8 percent–23 percent).

Interest in the use of organic materials for practical photovoltaic devices has been minimal due to the very low power conversion efficiencies. For example, the most typical values are in the range of 0.01 percent–0.1 percent for various metal phthalocyanine systems, and of the order of 0.01 percent for chlorophyll systems. Apart from the low power conversion efficiencies, however, organic materials in the form of thin film polymer dispersions would offer extremely attractive economical advantages over inorganic devices.

Representative prior art efforts in the field of this invention are contained in the disclosure of the following U.S. Pat. Nos. 3,009,981, photoelectric cells employing millimeter-thick layers of polyphthalocyanines; 3,057,947, photoelectric cells employing millimeter-thick layer of phthalocyanine as one of two photoactive components; 3,789,216, externally biased photocells comprised of thin-film phthalocyanines, for sensing red laser emissions; 3,844,843, solar cells employing organic semiconductors dispersed in a gel; 3,530,007, discloses the use of other organic photosensitive materials in a photovoltaic cell and refers to phthalocyanine as having related properties though no suggestion is made to utilize phthalocyanine in a photovoltaic cell. Relatively high efficiency photovoltaic cells utilizing evaporated merocyanine dyes have been described by D. L. Morel and co-workers in Applied Physics Letters 32(8), pages 495–497 (1978).

Photoelectrochemical behavior of phthalocyanines, both metal and metal-free, was reported by G. A. Alferov and V. I. Sevast'yanov in the Russian Journal of Physical Chemistry, Vol. 50 (1), 1976, pages 118–120, in an article entitled, "Photoelectrochemical Behavior of Phthalocyanines Under Galvanostatic Conditions." A liquid electrolyte interface was utilized to determine photocurrent.

The use of a metal phthalocyanine in a photovoltaic cell is reported by Amal K. Ghosh, Don L. Morel, Tom Feng, Robert F. Shaw, and Charles A. Rowe, Jr. in Journal of Applied Physics, Vol. 45, No. 1, Jan. 1974, in an article entitled, "Photovoltaic and Rectification Properties of Al/Mg Phthalocyanine/Ag Shottkey Barrier Cells." Earlier work by Vartanian and Karpovich, and also by Tollin et al. is referred to as evidence that the photoconductivity action spectra of metal-free phthalocyanine are dependent on the thickness and direction of irradiation. More recently, M. J. Federov and co-workers have disclosed photocells based upon metal phthalocyanines in Soviet Physics Journal 20, page 695 (1977).

While organic photoactive materials have been previously utilized in photovoltaic cells, all have suffered the common deficiency of very low power conversion. That is, the amount of electrical current actually made available for use by the cell is small in comparison to the amount of solar energy impinging upon the cell. Metal phthalocyanines and polyphthalocyanines have been utilized in photovoltaic cells but with very poor power conversion efficiency. Thus, an efficient low-cost photovoltaic cell has not been previously available.

SUMMARY OF THE INVENTION

It is the principal object of this invention to provide a relatively efficient photovoltaic cell employing a barrier electrode relatively compatible with an inexpensive organic photoactive material.

Another object of this invention is to provide a photovoltaic cell which would yield improved power conversion efficiencies over prior art cells utilizing organic photoactive materials.

Another object of this invention is to provide an efficient photovoltaic cell which is easily and inexpensively fabricated.

The above objects are achieved by providing a photovoltaic cell comprising a photoactive layer comprising metal-free phthalocyanine dispersed in a binder material, sandwiched between an ohmic electrode and a barrier electrode comprising a metal having a conductive oxide and a fermi level below about 4.7. By conductive, it is meant an electrical resistance below about 200 ohm square. Typical such metals include indium and tin. When fabricated according to the following specification, the cell is capable of providing power conversion efficiencies in excess of other cells while utilizing inexpensive organic photoactive materials. Although any of the various known forms of metal-free phthalocyanines can be employed, the x-form is preferred, because it has exhibited higher conversion efficiency than the other forms.

BRIEF DESCRIPTION OF THE DRAWINGS

This invention will be more clearly understood from the following description of the specific embodiments read in conjunction with the accompanying drawings wherein.

DETAILED DESCRIPTION OF THE INVENTION

Figure 1:
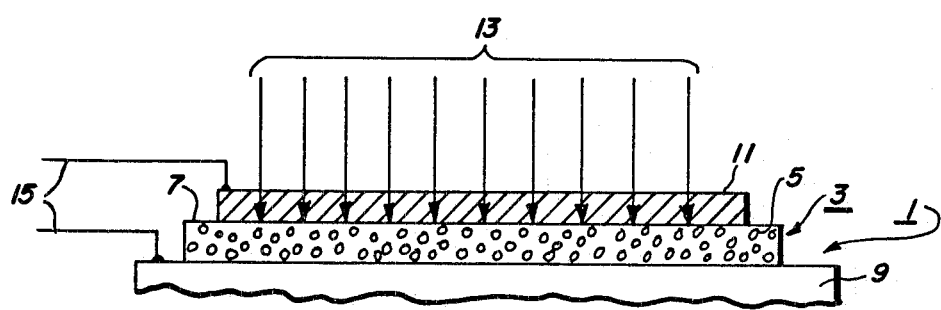
FIG. 1 is a side view in partial section of a photovoltaic cell of this invention.

In FIG. 1, there is shown cell 1 comprising a photoactive layer 3 containing a dispersion of metal-free phthalocyanine 5 in a binder 7. Photoactive layer 3 resides on electrode 9. Electrode 9 provides an ohmic contact with layer 3 and can be homogeneously electrically conductive or preferably is electrically insulating with a thin layer of conductive material at the interface with layer 3. A barrier electrode 11 is provided on layer 3 which is sufficiently transparent to permit light rays 13 to penetrate through to layer 3. Electrode 11 is typically very thin. FIG. 1 is shown in expanded view of clarity of description. Leads 15 provide connection of the cell to an electrical circuit utilizing the current produced by the cell upon solar irradiation.

The photovoltaic cell of this invention is easily fabricated by utilizing conventional equipment. To provide photoactive layer 3, the metal-free phthalocyanine, either alpha-, beta- or x-form, is first dispersed in an electrically insulating binder. The amount of phthalocyanine in the photoactive layer can vary widely and any operable amount can be utilized. As will be more fully described below, typically the amount of metal-free phthalocyanine, by weight, can vary widely from an operable amount to 95 percent or more. Preferably, the amount of phthalocyanine in the binder is in the range of from about 55 percent to about 75 percent. The maximum observed efficiency has been found to be photoactive layers having from about 55 percent to about 65 percent, by weight, metal-free phthalocyanine.

The dispersion is then coated by conventional means onto electrode 9, thereby providing an ohmic contact with the photoactive material. Any electrode having the proper Fermi level in relation to the photoactive layer can be employed in the photovoltaic cells of this invention. Typical materials for the ohmic electrode include gold, silver, platinum, copper and tin oxide. The dry thickness of photoactive layer 3 can vary widely and is typically in the range of from about 0.2 microns to about 200 microns in thickness, preferably from about 1 to about 3 microns. Any operable thickness can be employed but thicker layers waste material and reduce cell efficiency while extremely thin layers are difficult to manufacture uniformly. However, since light absorbance into the binder layer is extremely short, any thickness in excess of such absorbance depth is satisfactory.

Upon drying, the coating is provided with a second electrode 11 (a so-called Shottky barrier) by any suitable means. Typically, an extremely thin layer of appropriate metal is deposited onto layer 3 as by evaporating the metal and condensing it thereon. Each electrode is provided with contact means 15 which permits easy connection with an electrical circuit utilizing the electrical current.

While any suitable binder can be employed as binder 7, the most readily available and inexpensive binders are the polymers and copolymers. Typical polymers include purified polyvinylcarbazole, polyvinylacetate, polycarbonate, for example, a product available under the tradename Lexan ® from General Electric Corporation, polystyrene, polystyrene acrylonitrile copolymer and polyacrylonitrile. Preferred binders are those providing the best dark insulating properties, as for example, polyvinyl carbazole.

The photoactive layer of this invention can include a sensitizing agent to broaden or otherwise affect the absorption spectrum. A broadened spectral response enables greater light absorption. Typically, sensitizing agents are included in the photoactive layer 3 in the range of from an effective amount to about 20 percent, by weight. Typical sensitizers include Coumarine 6, Rhodamine 6G, Rubrene, perylene, 9,10-bis(phenylacetylene) anthracene and 1,4-diphenylisobenzofuran.

The extension of spectral response of metal-free phthalocyanine by means of dye sensitization is achieved by various methods. One method involves the diffusing of a dye into the precoated film of binder containing the phthalocyanine, for example, to a depth of 400 Angstroms. Another method is to evaporate a thin film of the sensitizing dye onto the top of the binder layer prior to placing the barrier electrode thereon. A preferred method is to prepare a solution of binder material and sensitizing dye in a common solvent. The metal-free phthalocyanine is then suspended in the solution, and the suspension coated onto an appropriate electrode.

Sensitizing dyes are selected so as to provide the optimum efficiency of the cell. Some criteria for selection aside from material cost and ease of fabrication is the effect on carrier generation which should not be lowered and the series resistance of the cell which must not be increased. Because of the coincidence of favorable properties, Coumarine 6, Rhodamine B, and Rhodamine 6G are preferred.

In one method of fabrication, a dispersion of phthalocyanine is prepared in a solution of the binder material in a volatile solvent. The suspension is ball milled so as to disperse the pigment. The polymorph is identified by its characteristic absorption spectrum having the pattern indicated in U.S. Pat. No. 3,932,180, or by J. H. Sharp and M. Lardon in Journal of Physical Chemistry, 72, 3230 (1968). The process of ball milling usually takes several hours. When the pigment is dispersed in binder solution, the suspension is coated by means of typical coating equipment onto a cleaned electrically conductive surface and dried thereon. One such coating means is a wire wound draw down rod. Other methods of coating are spin and dip coating. A doctor blade applicator can also be utilized to provide a uniform photoactive layer.

After suitable drying of the metal-free phthalocyanine binder layer, as by vacuum drying, a barrier electrode layer is placed onto the free surface of the photoactive layer 3. A preferred method is to form a metal-semiconductor barrier by the deposition of a suitable transparent conductive film, such as by evaporation onto the layer to form the Shottkey barrier. The desired thickness of electrode 11 is dependent on the light transmittance of the metal. For barrier electrodes of this invention, the thickness can be reduced to very small dimensions. For example, indium film thickness down to 600 A are equivalent in performance to thickness up to about 2,000 A. Ideally, a completely transparent barrier electrode 11 is optimum. Electrodes less than 600 A thick increase the cell series resistance and thus the efficiency is reduced. However, usable metals are those providing adequate barrier contact and electrical conduction while maintaining adequate light transmittance.

Metals having a conductive oxide have been found to provide superior barrier electrodes. During fabrication, some oxidation of the metal forming the barrier electrode cannot be prevented in the case of most metals. However, if the oxide is conductive, such oxidation does not effect the performance of the photovoltaic cell as much as less conductive oxides found in many metals. Accordingly, the combination of proper fermi level and oxide coductivity provides superior photovoltaic effects. Since metal-free phthalocyanine is a p-type semiconductor, the metal employed as a barrier electrode should have a low work function, optimally in the range of from about 3.8 to about 4.5 electron volts.

Figure 2:
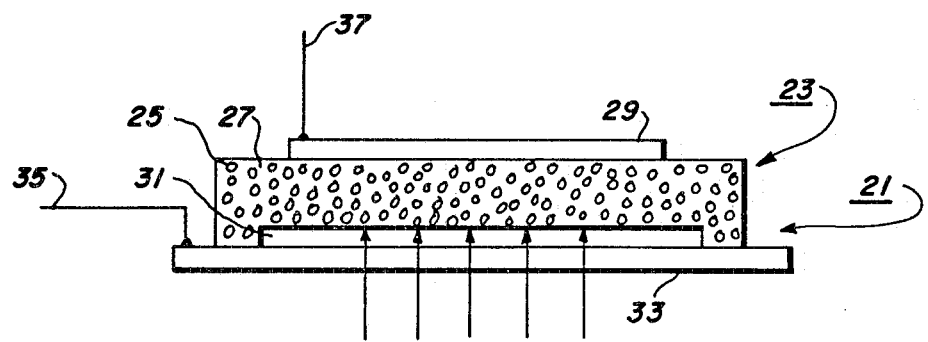
FIG. 2 is a side view in partial section of an alternative embodiment of the photovoltaic cell of this invention.

In an alternative embodiment, there is shown in FIG. 2 a photovoltaic cell of this invention wherein the barrier electrode is protected with a transparent protective coating. In FIG. 2, cell 21 comprises photoactive layer 23 comprising metal-free phthalocyanine particles 25 dispersed in binder 27. In both FIGS. 1 and 2, the drawings graphically depict the dispersion of particles 5 and 25 in binder 7 and 27 in an expanded view. In actual practice, particles 5 and 25 may be in contact with each other rather than separated by binder material as shown in FIGS. 1 and 2 for purposes of explanation.

Conductive electrode 29 provides an ohmic contact with photoactive layer 23 and an appropriate transparent barrier electrode 31 is placed on the opposite side of layer 23. As in FIG. 1, barrier electrode 31 is shown in greatly expanded view. Over electrode 31 is placed a transparent protective layer 33. Layer 33 provides protection for the extemely thin barrier electrode 31 and can be comprised of any electrically insulating highly transparent material. A preferred protective coating is a glass plate having coated thereon a thin layer of conductive metal oxide to come in contact with electrode 31 thereby conducting electricity therefrom outside the cell through lead 35. Lead 37 provides a means for attaching electrode 29 to an electrical circuit whereby the generated electrical current is utilized.

In another embodimet of this invention, the photovoltaic cell includes a thin insulating layer between the barrier electrode and the photoactive layer. Such an insulating layer increases the stability and lifetime of certain photovoltaic cells which may suffer degradation because of interaction between the barrier electrode and the photoactive material. Typical insulating layers include silicon mono- and dioxide. Any operable thickness is employed and normally such insulating layers are in the range of from about 5 to about 20 Angstrom units. An optimum thickness is in the range of from about 10 to about 20 Angstrom units. The insulating layer can conveniently be applied by evaporating the insulating material and condensing it onto the photoactive layer and then depositing the barrier layer onto the insulating layer.

PREFERRED EMBODIMENTS OF THE INVENTION

In the following examples, the photovoltaic cell device is fabricated by first dispersing a specified weight of x-form metal-free phthalocyanine pigment in methylene chloride solution of binder sufficient to provide a final concentration of 60 weight percent phthalocyanine. The dispersion is ball milled for 2 hours using 100 grams of $\frac{1}{4}$ inch stainless steel balls. The ball milled slurry is then coated on a pre-cleaned ohmic electrode. A wire wound or draw bar is utilized to obtain a coating of a desired thickness. The coating is dried in vacuum at 25° C. for 24 hours. A semitransparent metal coating is vacuum vapor deposited onto the coating to form the barrier electrode. In the case of indium, a minimum thickness is required to provide adequate conductivity. The thickness which provides a sheet resistivity of 5 ohm square is provided which has a 1 percent light transmittance. At temperatures above 30° C., such thickness is the minimum, but below 30° C. adequate conductivity can be achieved with thinner films. Contact between the metal electrode on the coated film and an external electrical lead is made with an indium contact away from the area utilized to absorb radiant energy. An aluminum contact is made with the ohmic electrode.

Light intensities are measured by means of an Alphametric Radiometer, Model #1010, equipped with a Model P1100S calibrated light probe. The area of the photoactive film exposed to incident radiation is about 1 cm². Unless otherwise, noted, solar radiation is simulated utilizing a 500 watt xenon lamp in conjunction with a water and infra red filters. A power flux delivered by the system is 80 mWatts/cm². Electrical measurements are made with a Keithley 610 digital electrometer equipped with a Perkin-Elmer Model 56 Chart Recorder. The dark and light current-voltage characteristics of the cells are determined.

In discussing the various photoelectric effects, the terms "open circuit" voltage, $V_{oc}$, and "short circuit" current, $J_{sc}$ are utilized where the external load resistance, R, is much greater or much less than the internal cell resistance, respectively.

The percent efficiency (n) of the cell is determined according to the following formula:

$$n = \frac{J_{sc} \cdot V_{oc}}{I \cdot T_M} \times ff \times 100$$

wherein $T_M$ is the fraction of light transmitted through the barrier electrode, I is the incident light intensity in watts, $J_{sc}$ is the photocurrent passing through the external load at zero applied potential, and $V_{oc}$ is the potential developed across the cell at zero current flow. The term ff represents the fill factor, which is 0.33 in the device of this invention.

EXAMPLES I–V a photovoltaic cell is prepared as described above wherein x-formed metal-free phthalocyanine is dispersed in a solution of polyvinyl carbazole dissolved in methylene chloride. The slurry is then coated on a precleaned ohmic electrode comprising a glass plate having a transparent layer of tin oxide on its surface, commercially available under the tradename NESA ®, from the Pittsburgh Plate Glass Company. A dry coating thickness of 1.8 microns is obtained. A thin layer of indium is condensed on the surface of the dry layer to a thickness corresponding to a light transmission of 1.1 percent. The efficiency of the cell is determined at various light intensities express in mWatts/cm² ($I_{in}$) utilizing simulated solar light. The data obtained is presented in Table I below.

TABLE I

| Example No. | $I_{in}$ | Efficiency n |
|---|---|---|
| I | .8 | 1.1 |
| II | .4 | 1.03 |
| III | .2 | .9 |
| IV | .1 | .7 |
| V | 0 (dark) | 0 |

EXAMPLES VI-IX

A photovoltaic cell is constructed as described in Examples I-V with the exception that the NESA® electrode is replaced by a clean sheet of copper. The light transmission of the indium electrode is 1.0 percent. The cell power conversion efficiencies at various light intensities are presented in Table II below.

TABLE II

| Example No. | $I_{in}$ | Efficiency n |
|---|---|---|
| VI | .8 | 1.1 |
| VII | .4 | 1.1 |
| VIII | .2 | 1.08 |
| IX | .1 | 1.00 |

EXAMPLES X-XIII

A photovoltaic cell is provided as in Examples I-V. The cell power conversion efficiency is determined at various light intensities as in Examples I-V with the exception that the cell is irradiated using strongly absorbed monochromatic light at 600 nm. The light source is an argon-ion dye laser. The area of illumination is 0.4 cm² and the incident light intensity is 200 mWatt/cm² of which only 2 percent reaches the interface of the barrier electrode and photoactive layer. The power conversion efficiencies at various light intensities are shown in Table III below.

TABLE III

| Example No. | $I_{in}$ | Efficiency n |
|---|---|---|
| X | 2.0 | 1.04 |
| XI | 1.0 | 1.18 |
| XII | .5 | 1.29 |
| XIII | .2 | 1.43 |

EXAMPLES XIV-XVI

The procedure of Examples X-XIII are repeated utilizing a photovoltaic cell prepared as in Examples I-V with the exception that polyvinyl acetate is utilized as a binder in place of polyvinyl carbazole. The data obtained are presented in Table IV below.

TABLE IV

| Example No. | $I_{in}$ | Efficiency n |
|---|---|---|
| XIV | 3.7 | .4 |
| XV | .37 | .88 |
| XVI | .037 | 1.2 |

EXAMPLES XVII-XX

A photovoltaic cell is constructed as in Examples I-V with the exception that the indium barrier electrode is replaced with a tin barrier electrode. The efficiency of the cell is determined at various light intensities according to the procedure of Examples I-V. The light transmittance of the tin barrier electrode is 2.2 percent. The data obtained is presented in Table V below.

TABLE V

| Example No. | $I_{in}$ | Efficiency n |
|---|---|---|
| XVII | 1.8 | .28 |
| XVIII | .9 | .30 |
| XIX | .45 | .31 |
| XX | .22 | .33 |

EXAMPLES XXI-XXV

Figure 3:
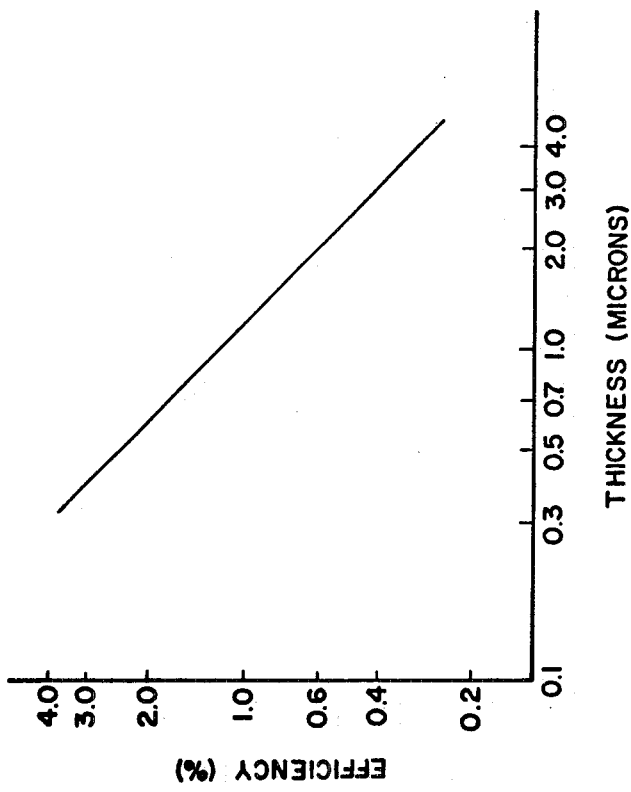
FIG. 3 is a graphical representation of the relationship between cell efficiency and thickness of the photoactive layer.

A series of photovoltaic cells are fabricated according to the above description of Examples I-V with the exception that the thickness of the phthalocyanine photoactive layer is varied. All of the cells contain 60 percent, by weight, concentration of x-form metal-free phthalocyanine and when the slurry is coated onto the NESA® electrode, the bar gap is varied so as to produce a range of layer thicknesses. The dry film thicknesses are found to be 2.7, 1.8, 1.2, 0.8 and 0.4 microns, respectively. Each cell is illuminated utilizing simulated solar light and an incident light intensity of about 1 mWatt/cm². The data obtained is illustrated in FIG. 3 which shows the relationship between the cell thickness and computed power conversion efficiency. FIG. 3 indicates a maximum observed value is for a cell having a photoactive layer of 0.4 microns in thickness.

EXAMPLE XXVI

Figure 4:
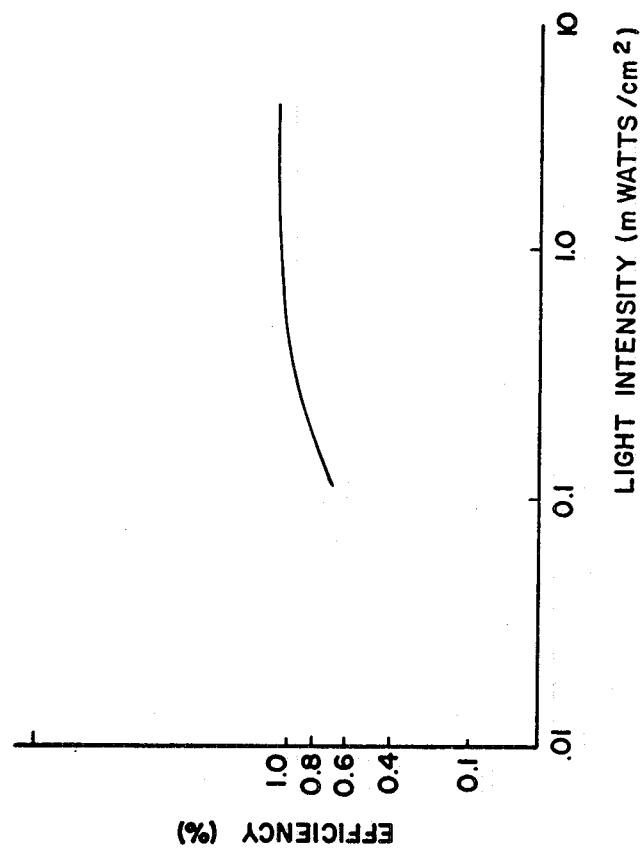
FIG. 4 is a graphical representation of the relationship between the cell efficiency and light intensity.

A photovoltaic cell is prepared as described above in Examples I-V wherein the photoactive layers each contain 60 weight percent concentration x-form metal-free phthalocyanine and having a dry film thickness of 1.8 microns. The power conversion efficiency as a function of light intensity is measured utilizing simulated solar light. The data indicates that efficiency is independent of light intensity and is graphically displayed in FIG. 4.

EXAMPLE XXVII

Figure 5:
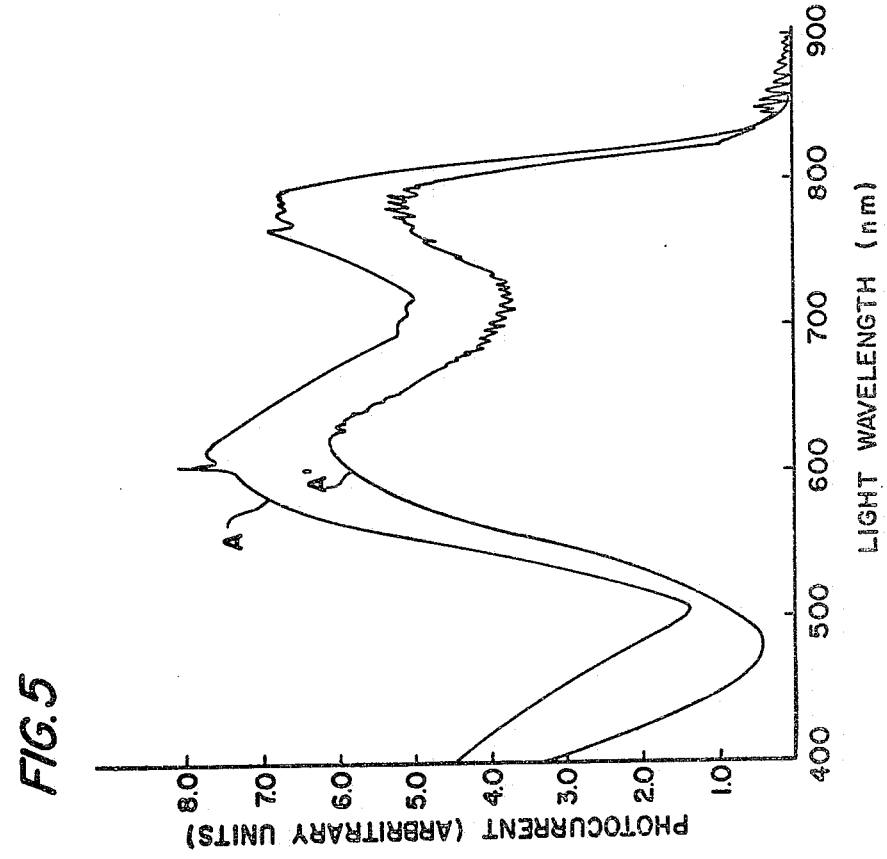
FIG. 5 is the light action spectrum of a dye sensitized cell of this invention.

A photovoltaic cell is prepared in accordance with the above-described procedure of Examples I-V. In addition to the photoactive pigment, a sensitizing dye, Coumarine 6 is added at a concentration of 14 percent, by weight. After drying, the photocurrent production of the cell is measured over the light spectrum from 400 to 900 Angstroms. The data obtained is illustrated in FIG. 5 wherein curves A and A' represent the measured photocurrent of the sensitized and unsensitized cells, respectively, through the spectrum.

EXAMPLES XXVIII-XXXI

A photovoltaic cell is fabricated as in Examples I-V with the exception that the x-form metal-free phthalocyanine is replaced by the alpha form metal-free phthalocyanine. The efficiency of the cell at various light intensities is determined and the results appear in Table VI below.

TABLE VI

| Example No. | $I_{in}$ | Efficiency n |
|---|---|---|
| XXVIII | 1.2 | .43 |
| XXIX | .6 | .43 |
| XXX | .3 | .41 |
| XXXI | .15 | .39 |

EXAMPLE XXXII

Figure 6:
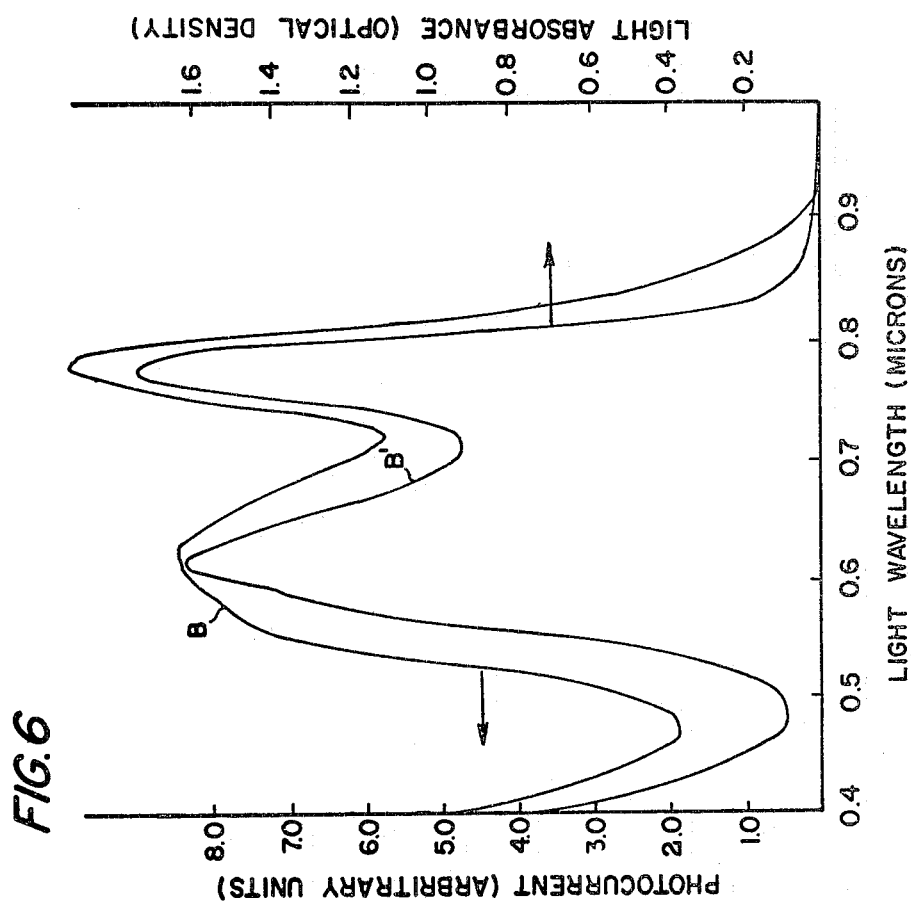
FIG. 6 is a light action spectrum of a typical photovoltaic cell of the invention.

A photovoltaic cell of Example I is prepared and exposed over the light spectrum from 400 to 900 Angstroms. The photocurrent and light absorbance is measured over said spectrum and the results obtained illustrated in FIG. 6. Curve B represents the photocurrent production and curve B' represents the light absorbance as indicated by optical density.

Although the invention has been described in terms of specific apparatus which is set forth in detail, it should be understood that this is by way of illustration only and that the invention is not necessarily limited thereto, since alternative embodiments and operating techniques will become apparent to those skilled in the art in view of the above disclosure. For example, additives can be incorporated into the photoactive layer to stabilize or enhance the operating ability of the cell. Typical stabilizer materials include tetrabutylammonium perchlorate and di-m-tolyl-diphenylbiphenyldiamine. Such stabilizers can be added to the binder solution in effective amounts ranging up to about 30 percent by weight of the photoactive layer. Electron acceptor materials can also be added to the photoactive layer in effective amounts up to about 15 percent by weight of the photoactive layer in the same manner as stabilizer materials. Typical electron acceptor materials include trinitrofluorenone, chloranil, ortho-benzoquinone, tetracyano-quindomethane and tetracyanoethylene. A preferred electron acceptor material is 2,4,7-trinitrofluorenone, because it is the most efficient such additive observed to date.

What is claimed is:

1. A photovoltaic device comprising a first, ohmic electrode and a second, barrier electrode and sandwiched therebetween a photoactive layer comprising metal-free phthalocyanine dispersed in an electrically insulating binder wherein the barrier electrode comprises a metal the oxide of which is electrically conductive.

2. The device of claim 1 wherein the barrier electrode is selected from the group consisting of indium and tin.

3. The device of claim 2 wherein the barrier electrode is indium.

4. The device of claim 1 wherein the metal-free phthalocyanine is in the x-form.

5. The device of claim 4 wherein the x-form metal-free phthalocyanine is present in the binder in the range of from about 15 to about 95 percent by weight.

6. The device of claim 4 wherein the x-form metal-free phthalocyanine is present in the binder in the range of from about 55 to about 65 percent by weight.

7. The device of claim 4 wherein the binder is a polymer selected from the group consisting of polystyrenes, polyacrylonitriles, polyvinylacetates, polycarbonates, copolymers of polystyrene and acrylonitrile, and polyvinylcarbazoles.

8. The device of claim 1 wherein the barrier electrode comprises a vapor deposited layer of indium having a thickness in the range of from 600 A to about 2,000 A.

9. The device of claim 1 wherein a light transparent protective layer resides on said barrier electrode.

10. The device of claim 1 wherein said photoactive layer is dye sensitized.

11. The device of claim 10 wherein the sensitizing dye comprises coumarine.

12. The device of claim 1 wherein the barrier electrode is tin.

13. A photovoltaic device comprising a first, ohmic electrode having coated thereon a photoactive layer comprising x-form metal-free phthalocyanine dispersed in an electrically insulating binder and a second, barrier electrode residing on said photoactive layer selected from the group consisting of indium and tin.

14. The device of claim 13 wherein the barrier electrode is vapor deposited.

15. The device of claim 13 further including a transparent protective coating over said barrier electrode.

16. The device of claim 13 wherein the barrier electrode is indium.

17. The device of claim 13 wherein the barrier electrode is tin.

18. The method of converting light energy into electrical energy which comprises providing a device comprising a first, ohmic electrode and a second, barrier electrode and sandwiched therebetween a photoactive layer comprising metal free phthalocyanine dispersed in an electrically insulating binder wherein the barrier electrode comprises a metal, the oxide of which is electrically conductive and exposing to light the photoactive layer through said barrier electrode.

19. The method of claim 18 wherein the barrier electrode is selected from the group consisting of indium and tin.

20. The method of claim 19 wherein the barrier electrode is indium.

21. The method of claim 19 wherein the barrier electrode is tin.

22. The method of claim 18 wherein the metal free phthalocyanine is in the x-form.

23. The method of claim 18 wherein the metal free phthalocyanine is present in the binder in the range of from about 15 to about 95 percent by weight.

24. The device of claim 23 wherein the metal free phthalocyanine is present in the binder in the range of from about 55 to 65 percent by weight.

25. The method of claim 18 wherein said photoactive layer is dye sensitized.

* * * * *

UNITED STATES PATENT AND TRADEMARK OFFICE
CERTIFICATE OF CORRECTION

PATENT NO. : 4,175,982
DATED : November 27, 1979
INVENTOR(S) : Rafik O. Loutfy et al.

It is certified that error appears in the above-identified patent and that said Letters Patent are hereby corrected as shown below:

In the Abstract, lines 3-4, "insulated" should be --insulative--.

Signed and Sealed this

Tenth Day of June 1980

[SEAL]

Attest:

Attesting Officer

SIDNEY A. DIAMOND
Commissioner of Patents and Trademarks